US010128323B2

(12) United States Patent
Yang et al.

(10) Patent No.: US 10,128,323 B2
(45) Date of Patent: Nov. 13, 2018

(54) DISPLAY MODULE AND ELECTRONIC DEVICE HAVING SAID DISPLAY MODULE

(71) Applicant: SHENZHEN ROYOLE TECHNOLOGIES CO. LTD., Shenzhen (CN)

(72) Inventors: Songling Yang, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/507,962

(22) PCT Filed: Sep. 2, 2014

(86) PCT No.: PCT/CN2014/000818
§ 371 (c)(1),
(2) Date: Mar. 1, 2017

(87) PCT Pub. No.: WO2016/033704
PCT Pub. Date: Mar. 10, 2016

(65) Prior Publication Data
US 2017/0288006 A1    Oct. 5, 2017

(51) Int. Cl.
*H01L 27/32*    (2006.01)
*H01L 51/00*    (2006.01)
(Continued)

(52) U.S. Cl.
CPC .......... *H01L 27/3276* (2013.01); *G09F 9/301* (2013.01); *G09F 9/33* (2013.01);
(Continued)

(58) Field of Classification Search
None
See application file for complete search history.

(56) References Cited

U.S. PATENT DOCUMENTS

2008/0303972 A1    12/2008    Han et al.
2011/0062434 A1    3/2011    Eguchi et al.
(Continued)

FOREIGN PATENT DOCUMENTS

EP    1237036 A1    9/2002
EP    2733912 A1    5/2014
(Continued)

OTHER PUBLICATIONS

Office Action dated Feb. 27, 2018 from corresponding application No. JP 2017-511999.
(Continued)

*Primary Examiner* — Jay C Chang
(74) *Attorney, Agent, or Firm* — Hauptman Ham, LLP

(57) ABSTRACT

A display module (10) and an electronic device having the display module are provided. The display module (10) includes a substrate (20) and a flexible screen (30). The substrate (20) may include a front surface (22) having a first curvature, a back surface (24) opposite to the front surface (22), and at least two side surfaces (26, 28, 29) located beside the front surface (22) and having a second curvature, and the second curvature is larger than the first curvature. The flexible screen (30) may include at least two non-display regions (38) and an effective region (36) having a light-emitting element array (31), the effective region (36) may include a main portion (36a) bonded to the front surface (22) and at least two edge portions (36b, 36c) bonded to the side surfaces, and the at least two non-display regions (38) extend to the back surface (24).

20 Claims, 8 Drawing Sheets

(51) Int. Cl.
*G09F 9/30* (2006.01)
*G09F 9/33* (2006.01)
*H01L 51/52* (2006.01)

(52) U.S. Cl.
CPC ...... *H01L 27/3225* (2013.01); *H01L 51/0097* (2013.01); *H01L 51/5237* (2013.01); *H01L 2251/5338* (2013.01)

(56) References Cited

U.S. PATENT DOCUMENTS

| | | | |
|---|---|---|---|
| 2011/0095999 A1* | 4/2011 | Hayton | G06F 1/1626 345/173 |
| 2012/0146886 A1* | 6/2012 | Minami | H01L 27/3276 345/80 |
| 2013/0002133 A1 | 1/2013 | Jin | |
| 2013/0002572 A1 | 1/2013 | Jin | |
| 2013/0002583 A1 | 1/2013 | Jin | |
| 2013/0083496 A1 | 4/2013 | Franklin | |
| 2014/0084254 A1* | 3/2014 | Li | H01L 27/3251 257/40 |
| 2014/0104762 A1 | 4/2014 | Park | |
| 2014/0126228 A1 | 5/2014 | Lee et al. | |
| 2015/0138041 A1* | 5/2015 | Hirakata | H01L 27/3276 345/1.3 |
| 2015/0173176 A1* | 6/2015 | Lee | H05K 1/0259 361/749 |

FOREIGN PATENT DOCUMENTS

| | | |
|---|---|---|
| JP | 2001-117504 A | 4/2001 |
| JP | 2002-258758 A | 9/2002 |
| JP | 2008-096543 A | 4/2008 |
| JP | 2010-060866 A | 3/2010 |
| JP | 2013-015835 A | 1/2013 |
| JP | 2013-015836 A | 1/2013 |
| JP | 2014132319 A | 7/2014 |
| WO | 2014034169 A1 | 3/2014 |

OTHER PUBLICATIONS

Extended European search report dated May 18, 2018 from corresponding application No. EP 14901290.8.

* cited by examiner

DISPLAY MODULE AND ELECTRONIC DEVICE HAVING SAID DISPLAY MODULE

TECHNICAL FIELD

The present disclosure relates to display modules, and particularly to a display module having a larger viewable area proportion.

BACKGROUND

For the structure of liquid crystal display (LCD) panels, liquid crystal is arranged between two parallel rigid rectangular glass substrates. Thin film transistors (TFTs) are arranged on the lower substrate glass, and color filters are arranged on the upper substrate glass. The rotation directions of the liquid crystal molecules are controlled by change of signal and voltage of the TFTs, so that whether polarized light of each pixel can emit is controlled and the display purpose is achieved. As the liquid crystal is liquid, the periphery of the upper and lower glass substrates is provided with a sealing device for example sealing adhesive to seal the liquid crystal, which results in that the periphery of the liquid crystal panel is provided with a frame which cannot display images.

With the development of technology, organic light-emitting diode (OLED) panels are developed, and the OLED panel includes two layers of electrode arranged on the rigid glass substrate and a layer of organic material sandwiched between the two layers of electrode. As the organic material cannot randomly flow, a frame is not needed to seal the organic material. A present OLED panel includes a rectangular effective display region arranged in the center of the OLED panel and a wiring region arranged in the periphery of the OLED panel, and the wiring region is used to couple control lines and data lines of the effective region to corresponding controllers. As the wiring region does not have display function, a proportion that the effective region of the OLED panel takes up the whole panel reduces, that is, the viewable area proportion is still smaller. Presently, with the development of flexible OLED screens, a larger development space for further improving the viewable area proportion exists.

SUMMARY

The present disclosure provides a display module having a flexible screen and a larger viewable area proportion.

A display module may include a substrate and a flexible screen. The substrate may include a front surface having a first curvature, a back surface opposite to the front surface, and at least two side surfaces located beside the front surface and having a second curvature, and the second curvature is larger than the first curvature. The flexible screen may include at least two non-display regions and an effective region having a light-emitting element array, the effective region may include a main portion bonded to the front surface and at least two edge portions bonded to the side surfaces, and the at least two non-display regions extend to the back surface.

The present disclosure further provides an electronic device having the above display module.

Under the above technical features, four edges of the display module can display images, without frame, thus, the viewable area proportion of the display module increases. When the display module is assembled in an electronic device for example a mobile phone, four edges of the electronic device can be designed to do not have a frame, thus the attraction of the electronic device is improved.

BRIEF DESCRIPTION OF THE DRAWINGS

The following accompanying drawings are used to specifically illustrate various embodiments of the present disclosure in combination with detailed embodiments. It can be understood that sizes and proportion relationships of various elements illustrated by the accompanying drawings do not represent actual sizes and actual proportion relationships, and the accompanying drawings are diagrammatic views for clear illustration, and should not be understood as limitations for the present disclosure.

DETAILED DESCRIPTION

To make the purposes, technical solutions, and advantages of the present disclosure be clearer, the following will further specifically illustrate the present disclosure in combination with various embodiments and the accompanying drawings. It can be understood that the described embodiments are just used to illustrate the present disclosure, and not used to limit the present disclosure.

Figure 1:
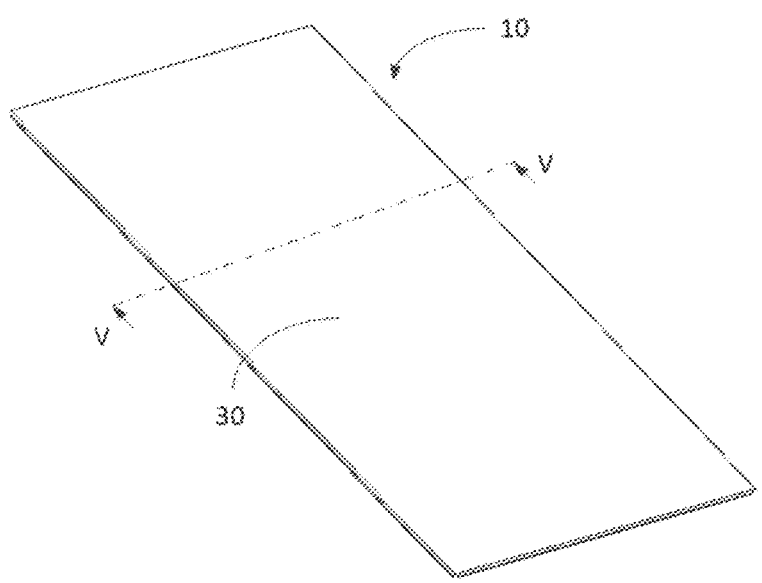
FIG. 1 is a diagrammatic view of a display module in accordance with a first embodiment of the present disclosure.
Figure 2:
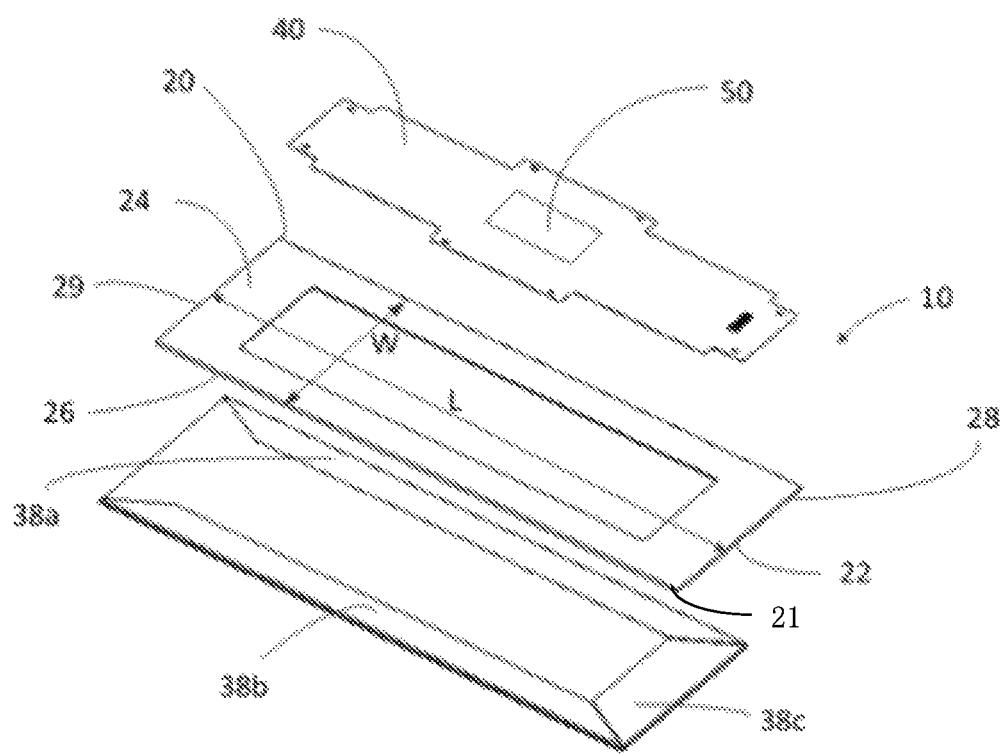
FIG. 2 is a partially exploded view of the display module of FIG. 1, viewed from another viewpoint.

In combination with FIG. 1 and FIG. 2, FIG. 1 and FIG. 2 are diagrammatic views of a display module 10 after assembled in accordance with a first embodiment of the present disclosure. The display module 10 includes a substrate 20, a flexible screen 30, a flexible circuit board 40, and an integrated controller 50. The substrate 20 is rectangular and includes a front surface 22, a back surface 24 opposite to the front surface 22, two first side surfaces 26 extending along a longitudinal direction of the substrate 20, a second side surface 28 extending along a short side direction of the substrate 20 and a third side surface 29 extending along the short side direction of the substrate 20. The front surface 22 and the back surface 24 are planar faces parallel to each other. The first side surface 26 and the second side surface 28 are semi-cylindrical surfaces, and are tangent to the front surface 22 and the back surface 24, and the feature is more apparent in FIG. 5. The third side surface 29 is a planar face perpendicular to the front surface 22 and the back surface 24. The length of the substrate 20 (the maximum distance between the second side surface 28 and the third side surface 29) is L, and the width (the maximum distance between the two side surfaces 26) is W.

Figure 3:
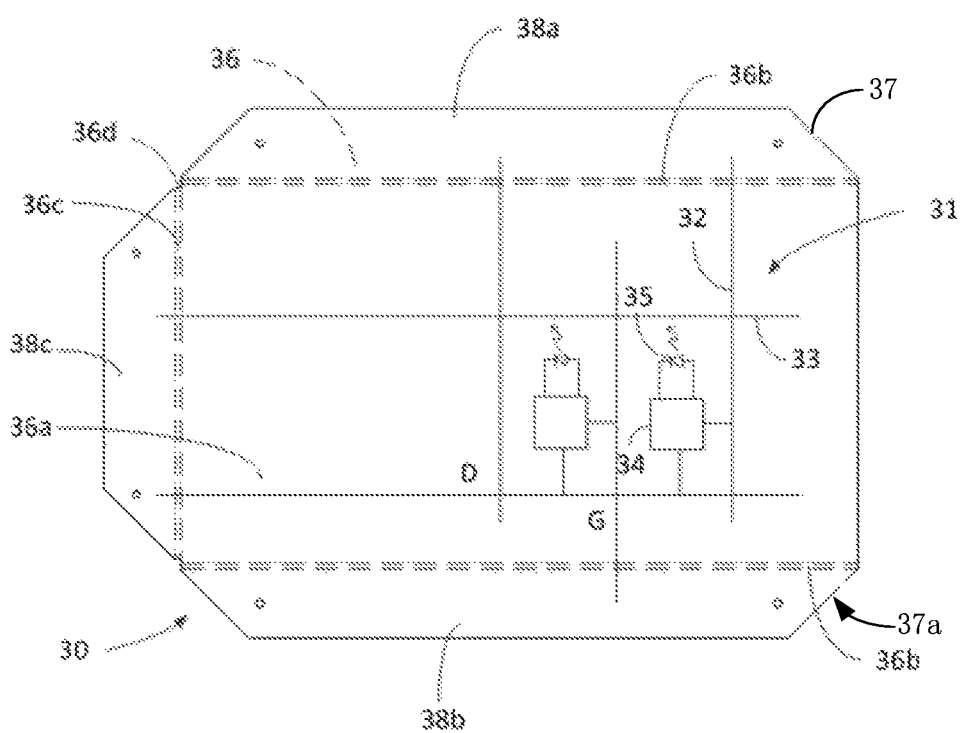
FIG. 3 is an expanded view of a flexible screen of the display module of FIG. 1 before assembled.

In combination with FIG. 3, the flexible screen 30 is a square having chamfers at four corners after expanded, and includes an effective region 36 having a light-emitting element array 31 and three non-display regions 38a, 38b, 38c which are substantially trapezoidal. The effective region 36 includes a rectangular main portion 36a, two first edge portions 36b extending outward from the elongated sides of the main portion 36a, and a second edge portion 36c extending outward from the short side of the main portion 36a. The first edge portion 36b is rectangular, and the length of the first edge portion 36b is equal to that of the elongated side of the main portion 36a. The second edge portion 36c is rectangular, and the length of the second edge portion 36c is equal to that of the short side of the main portion 36a. Gaps 36d each is formed between the second edge portion 36c and one of the first edge portion 36b adjacent to the second edge portion 36c. The three non-display regions 38a, 38b, 38c respectively extend outward from the corresponding edge portions 36b and the edge portion 36c. A sum of the width of the main portion 36a and the width of the two first edge portions 36b is larger than W, and a sum of the length of the main portion 36a and the second edge portion 36c is larger than L.

The light-emitting element array 31, that is, a pixel array, includes gate lines 32 and data lines 33 which are mutually intersected (in the embodiment, mutually orthogonal), control circuits 34 each arranged between the adjacent gate line 32 and data line 33, and light emitting units 35 each coupled to one corresponding control circuit 34, for example, organic light emitting diodes. Each control circuit 34 is coupled to the corresponding gate line 32 and data line 33 to receive corresponding control instructions, so as to control on or off of the light emitting unit 35. The odd gate lines 32 and the even gate lines 32 respectively extend to the corresponding non-display regions 38a and 38b via the two first edge portions 36b. The data lines 33 extend to the corresponding non-display region 38c via the second edge portion 36c.

Figure 4:
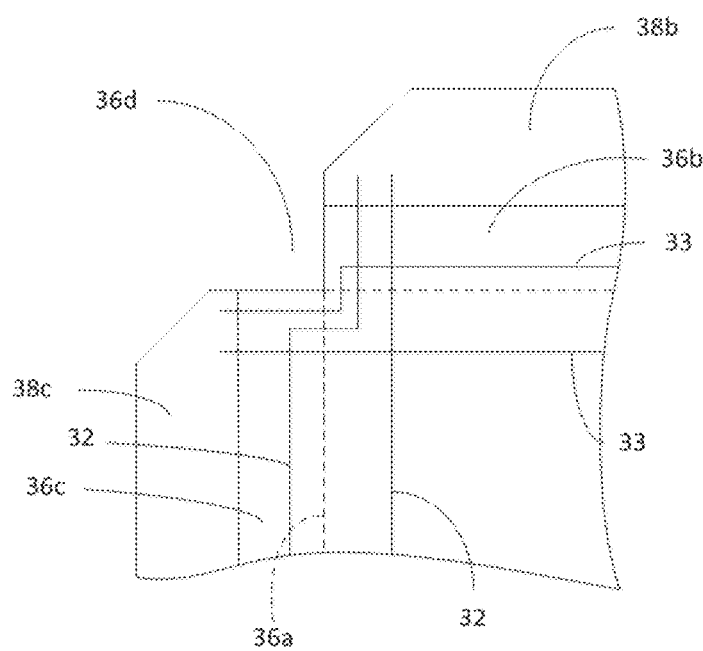
FIG. 4 is a partially enlarged view of the flexible screen of FIG. 3.

In combination with FIG. 4, the data lines 33 within the first edge portion 36b is turned toward the main portion 36a, and further extend to the corresponding non-display region 38c via the second edge portion 36c. The odd and even gate lines 32 within the second edge portion 36c (only one gate line is illustrated by FIG. 4) are all turned toward the main portion 36a, and further extend to the corresponding non-display regions 38a and 38b via the two first edge portions 36b. By doing so, all of the data lines 33 extend to the non-display region 38c, and all of the odd and even gate lines 32 extend into the non-display regions 38a and 38b.

When assembling, the center of the effective region 36 is aligned with the center of the front surface 22 of the substrate 20, and the elongated sides of the effective region 36 and the front surface 22 of the substrate 20 are parallel to each other. The non-display regions 38a and 38b are then bent toward the back surface 24 respectively along the two first side surfaces 26, and are secured to the back surface 24 via adhesive or other. The non-display region 38c is then bent toward the back surface 24 along the second side surface 28, and can be also secured to the back surface 24 via adhesive or other. By means of the chamfers of the non-display regions, the non-display regions are bent to the back surface without overlapping. However, in other embodiments, overlapping may exist, thus, the structure illustrated by FIG. 1 and FIG. 2 is formed.

Figure 5:
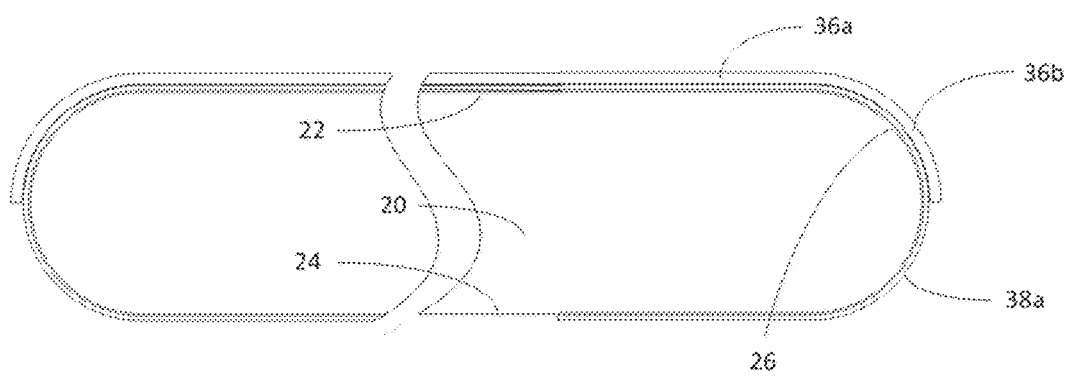
FIG. 5 is a cross-section view of the display module of FIG. 1, taken along line V-V.

As illustrated by FIG. 5, the main portion 36a covers the front surface 22 of the substrate. The first edge portion 36b covers a half of the arc of the first side surface 26. Similarly, the second edge portion 36c covers a half of the arc of the second side surface 28 (not illustrated). As illustrated by FIG. 1, the flexible circuit board 40 is coupled to the gate lines 32 and the data lines 33 of the three non-display regions 38a, 38b, and 38c. The integrated controller 50 is arranged on the flexible circuit board 40, and is coupled to the gate lines 32 and the data lines 33, so as to transmit the above control instructions to the gate lines 32 and the data lines 33. By doing so, the display module 10 is formed. It can be understood that the integrated controller 50 can be also arranged on another surface of the flexible circuit board 40 facing to the substrate 20. At this point, a position of the back surface 24 corresponding to the integrated controller 50 can define a receiving groove (not illustrated) to receive the integrated controller 50.

As illustrated by FIG. 1, when the display module 10 after assembled is viewed from the front, four edges of the display module 10 can display images, without frame, thus the viewable area proportion of the display module 10 increases. With the reduction of the radius of the curvature of the two first side surfaces 26, after the first edge portions 36b and the second edge portion 36c are bent, the gaps 36d become small. When the radius of the curvature is small enough, the gaps 36 will not affect a user at all when viewing the screen. When the display module 10 is assembled in a mobile phone, four edges of the mobile phone can be designed to do not have a frame, thus the attraction of the mobile phone is improved. Certainly, the display module 10 can be applied in a tablet computer, an all-in-one computer, a display, a television, and other electronic devices. It can be understood that the display module 10 can be a quadrate or other shapes, and can be designed according to specific requirements of the electronic device. It can be understood that the length of the portion of the first side surface 26 covered by the first edge portion 36b is less than or larger than a half of the length of the arc of the first side surface 26, and the length of the portion of the second side surface 28 covered by the second edge portion 36c, is less than or larger than a half of the length of the arc of the the second side surface 28, which can be determined according to the specific design of the electronic device.

Figure 6:
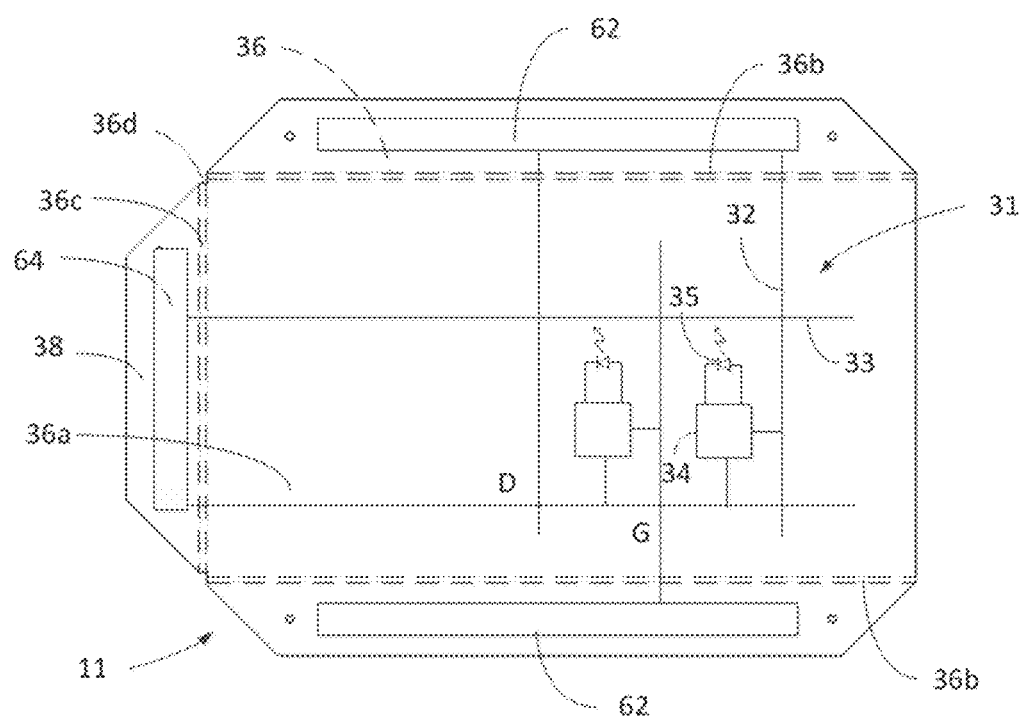
FIG. 6 is a diagrammatic view of a display module in accordance with a second embodiment of the present disclosure, viewed from a viewpoint similar to that of FIG. 3.

In combination with FIG. 6, a display module 11 in accordance with a second embodiment of the present disclosure is provided. In FIG. 6, only the flexible screen and the controller are illustrated. A difference between the display module 11 and the display module 10 of the first embodiment is that for the display module 11, three controllers are used to replace the above integrated controller 50, and the three controllers are respectively two gate line controllers 62 and a data line controller 64. The two gate line controllers 62 are respectively coupled to the odd gate lines 32 and the even gate lines 32, and the data line controller 64 is coupled to the data lines 33. The flexible circuit board 40 is coupled to the three controllers, and is also provided with an interface (not illustrated) for allowing an external device to be coupled to the display module.

Figure 7:
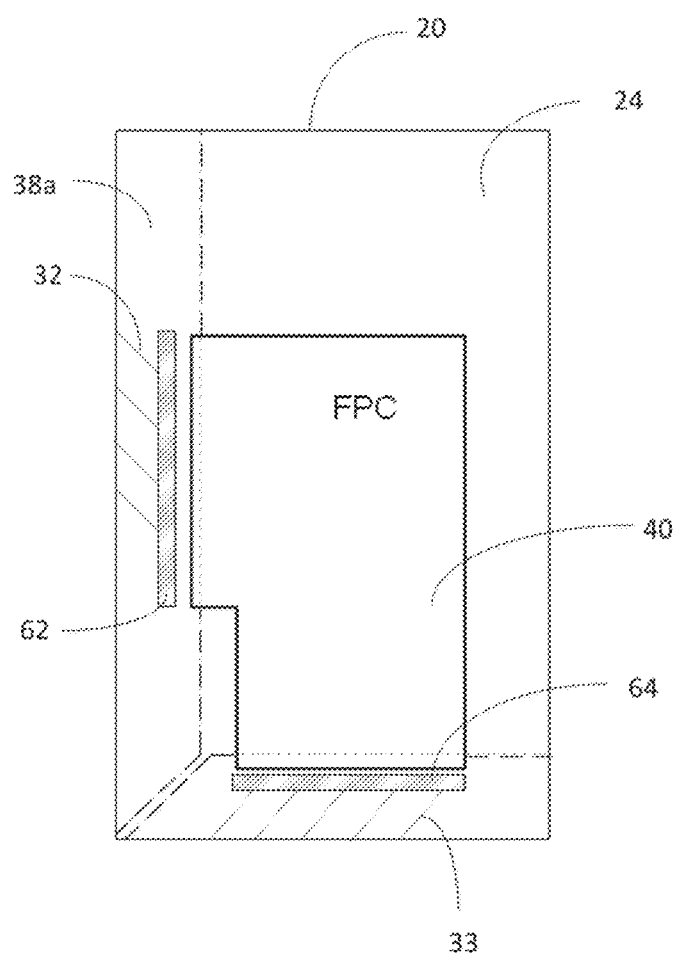
FIG. 7 is a rear view of a display module after assembled in accordance with a third embodiment of the present disclosure.
Figure 8:
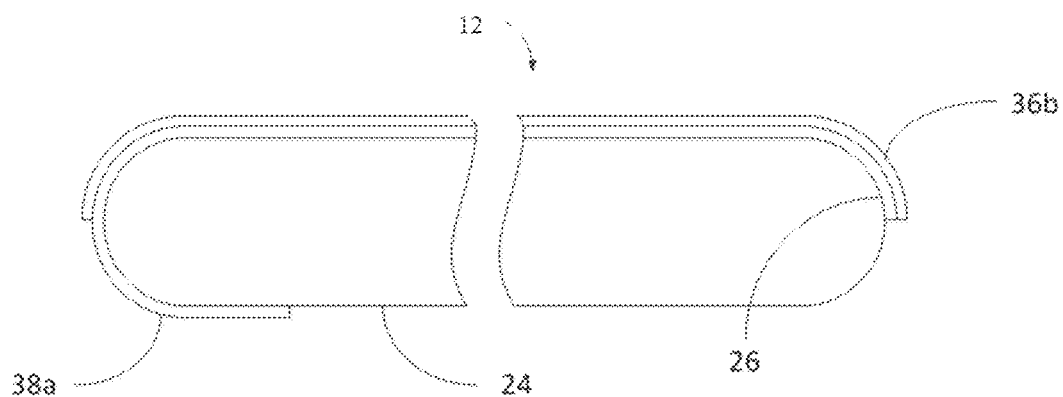
FIG. 8 is a cross-section view of the display module of FIG. 7.

In combination with FIG. 7 and FIG. 8, a display module 12 in accordance with a third embodiment is provided. A difference between the display module 12 and the display module 11 of the second embodiment is that all of the gate lines 32 of the flexible screen extend to the non-display region 38a which is parallel to the longitudinal direction of the substrate 20, the non-display region 38a is bent toward and secured to the back surface 24 of the substrate, and the edge portion 36b of the effective region opposite to the non-display region 38a is still bonded to the side surface 26. At this point, the display module 12 only needs one gate line controller. In the embodiment, the effect that four edges can display images described in the first embodiment can be also realized.

It can be understood that in the first, second, and third embodiment, each gate driver is not limited to an external driver made of silicon wafers, and can also be a gate driver arranged on an array substrate having a light-emitting element array, and the gate driver is manufactured by gate driver on array (GOA) technology.

Figure 9:
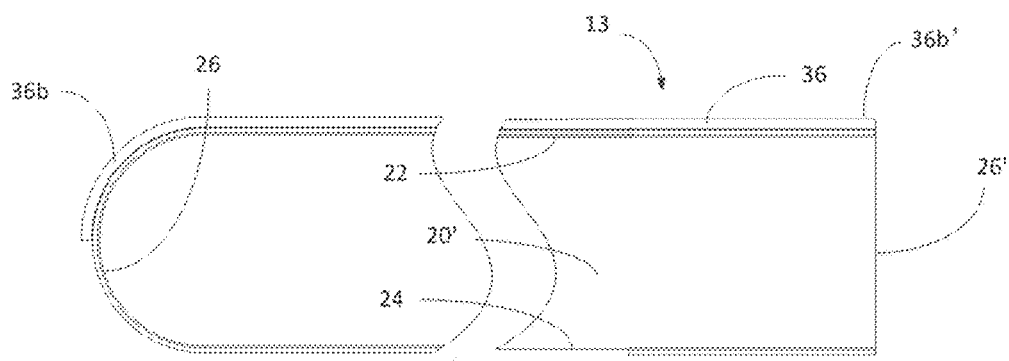
FIG. 9 is a cross-section view of a display module in accordance with a fourth embodiment of the present disclosure.

FIG. 9 is a display module 13 in accordance with a fourth embodiment of the present disclosure. A difference between the display module 13 and the display module 12 of the third embodiment is that only one first side surface 26 extending along the longitudinal direction of the substrate 20' is a semi-cylindrical surface, and another first side surface 26' is a planar face. The effective region 36 only includes one curved first edge portion 36b. An elongated side 36b' and a short side of the main portion of the effective region 36 are respectively aligned with a side surface 26b' and a side surface 29 (the callout 29 appears in FIG. 2) of two planar faces of the substrate.

Figure 10:
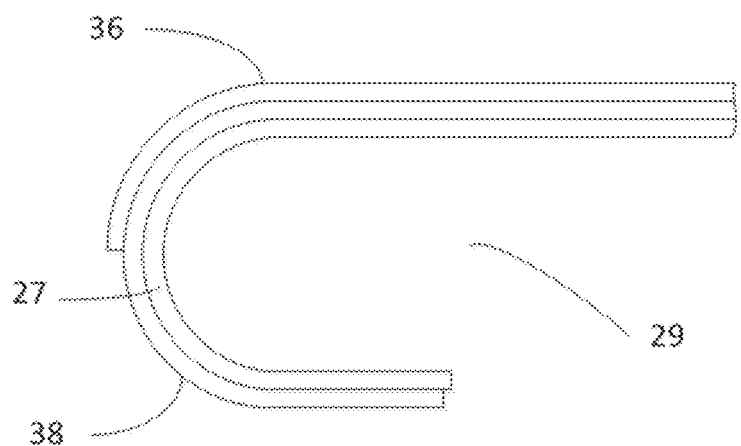
FIG. 10 is a partially cross-section view of a display module in accordance with a fifth embodiment of the present disclosure.

Optionally, in combination with FIG. 10, the substrate of the first, the second, the third, and the fourth embodiment can be formed when a rigid flat plate which can keep deformed shape after deformation is bent, for example, the substrate is formed when a thin steel plate 27 is bent. At this point, the steel plate 27 can be deformed to form a half-surrounded structure, and a hollow cavity 29 can be used to receive other components, for example, a circuit board of an electronic device having the display module.

Optionally, the substrate of the first, second, third, and fourth embodiment of the present disclosure can be a battery. At this point, the battery can be designed to have a shape of the substrate illustrated by the corresponding embodiment. At this point, the thickness of the electronic device having the display module can be reduced.

Figure 11:
FIG. 11 is a cross-section view of a display module in accordance with a sixth embodiment of the present disclosure.

Optionally, the substrates illustrated by the above embodiments can be bent, and the front surface 22 having the flexible screen thereon can be recessed in a certain curvature, which is illustrated by FIG. 11. It can be understood that the front surface 22 can also be upwardly convex in a certain curvature, or can be recessed or convex to form a substantial spherical surface. In brief, the front surface can be a concave surface or a convex surface, and the curvature of the concave surface or convex surface is less than that of the side surface. In addition, the side surface may not be a semi-cylindrical surface which is tangent to the front surface and the back surface, and what is needed is that the side surface can be smoothly connected to the front surface or the back surface, and the flexible screen will not be damaged by sharp angled objects. When the front surface is a flat surface, the curvature is zero, thus in combination with all of the above embodiments, all of that the curvature of the front surface of the substrate is less than that of the side surface of the substrate fall within the scope of the spirit of the present disclosure.

Preferably, in the various embodiments of the present disclosure, a touch layer (not illustrated) can be arranged on a surface of the flexible screen 30 opposite to the substrate 20, and the touch layer has a function of sensing touch.

As shown in FIGS. 2 and 3, the flexible screen 30, in an expanded state, is a square having four first corners 37, and each first corner 37 has a triangular chamfer 37a. The substrate 20 has second corners 21, which are thus covered by the first corners 37 of the flexible screen 30 respectively.

The foregoing descriptions are merely preferred embodiments of the present disclosure, rather than limiting the present disclosure. Any modifications, equivalent substations, and improvements with the spirit and principle of the present disclosure shall fall within the protection scope of the present disclosure.

What is claimed is:

1. A display module comprising:
    a substrate comprising a front surface having a first curvature, a back surface opposite to the front surface, and at least two side surfaces located beside the front surface and having a second curvature, the second curvature being larger than the first curvature; and
    a flexible screen comprising at least two non-display regions and an effective region having a light-emitting element array, the effective region comprising a main portion bonded to the front surface and at least two edge portions bonded to the side surfaces, and the at least two non-display regions extending to the back surface, wherein the flexible screen, in an expanded state, is a square having triangular chamfers at four corners.

2. The display module of claim 1, wherein the effective region comprises two edge portions, the two non-display regions extend to the back surface along the two edge portions.

3. The display module of claim 1, wherein the effective region comprises three edge portions, two of the three edges portions are parallel to each other, and the other of the three edge portions is perpendicular to the two remaining of the three edge portions; the flexible screen comprises three non-display regions, and the three non-display regions extend to the back surface along the three edge portions.

4. The display module of claim 1, wherein the front surface is a flat surface, a concave surface, or a convex surface, and the two side surfaces each is continuously connected to the front surface with no protruding portions therebetween.

5. The display module of claim 1, wherein the front surface and the back surface are flat surfaces, and the side surfaces are arc-shaped surfaces connected to the front surface and the back surface continuously with no protruding portions therebetween.

6. The display module of claim 1, wherein the substrate is formed when a flat plate which keeps deformed shape after deformation is bent.

7. The display module of claim 1, wherein the substrate is a battery.

8. The display module of claim 1, wherein the display module further comprises a controller arranged in one of the two non-display regions, and the controller is further arranged on the back surface.

9. The display module of claim 8, wherein the back surface defines a receiving groove, and the controller is received in the receiving groove.

10. The display module of claim 1, wherein a gap is formed between the two non-display regions adjacent to each other.

11. The display module of claim 10, wherein the effective region comprises two edge portions, the light-emitting element array comprises data lines and gate lines which are mutually intersected, the data lines or the gate lines arranged in one of the two edge portions and extending along a longitudinal direction of the one of the two edge portions are turned and pass through the other of the two edge portions to extend to one of the two non-display regions connected to the other of the two edge portions.

12. An electronic device comprising a display module which comprises:
- a substrate comprising a front surface having a first curvature, a back surface opposite to the front surface, and at least two side surfaces located beside the front surface and having a second curvature, the second curvature being larger than the first curvature; and
- a flexible screen comprising at least two non-display regions and an effective region having a light-emitting element array, the effective region comprising a main portion bonded to the front surface and at least two edge portions bonded to the side surfaces, and the at least two non-display regions extending to the back surface, wherein the flexible screen, in an expanded state, is a square having triangular chamfers at four corners.

13. The electronic device of claim 12, wherein the effective region comprises two edge portions, the two non-display regions extend to the back surface along the two edge portions.

14. The electronic device of claim 12, wherein the effective region comprises three edge portions, two of the three edges portions are parallel to each other, and the other of the three edge portions is perpendicular to the two remaining of the three edge portions; the flexible screen comprises three non-display regions, and the three non-display regions extend to the back surface along the three edge portions.

15. The electronic device of claim 12, wherein the front surface is a flat surface, a concave surface, or a convex surface, and the two side surfaces each is continuously connected to the front surface with no protruding portions therebetween.

16. The electronic device of claim 12, wherein the front surface and the back surface are flat surfaces, and the side surfaces are arc-shaped surfaces continuously connected to the front surface and the back surface with no protruding portions therebetween.

17. The electronic device of claim 12, wherein the substrate is a battery.

18. The electronic device of claim 12, wherein the display module further comprises a controller arranged in the two non-display regions, and the controller is further arranged on the back surface.

19. The electronic device of claim 12, wherein a gap is formed between the two non-display regions adjacent to each other.

20. The electronic device of claim 19, wherein the effective region comprises two edge portions, the light-emitting element array comprises data lines and gate lines which are mutually intersected, the data lines or the gate lines arranged in one of the two edge portions and extending along a longitudinal direction of the one of the two edge portions are turned and pass through the other of the two edge portions to extend to one of the two non-display regions connected to the other of the two edge portions.

* * * * *